United States Patent
Zheng et al.

(10) Patent No.: US 7,015,101 B2
(45) Date of Patent: Mar. 21, 2006

(54) MULTI-LEVEL GATE SONOS FLASH MEMORY DEVICE WITH HIGH VOLTAGE OXIDE AND METHOD FOR THE FABRICATION THEREOF

(75) Inventors: Jia Zhen Zheng, Singapore (SG); Pradeep Ramachandramurthy Yelehanka, Singapore (SG); Weining Li, Shanghai (CN)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 57 days.

(21) Appl. No.: 10/683,052

(22) Filed: Oct. 9, 2003

(65) Prior Publication Data
US 2005/0079674 A1  Apr. 14, 2005

(51) Int. Cl.
*H01L 21/336* (2006.01)
(52) U.S. Cl. .................. 438/258; 438/259; 438/261
(58) Field of Classification Search ......... 438/257, 438/258, 259, 261, 267, 558, 954
See application file for complete search history.

(56) References Cited

U.S. PATENT DOCUMENTS

| | | | |
|---|---|---|---|
| 6,110,842 A * | 8/2000 | Okuno et al. | 438/776 |
| 6,147,008 A | 11/2000 | Chwa et al. | |
| 6,383,871 B1 | 5/2002 | Nobel et al. | |
| 6,436,768 B1 | 8/2002 | Yang et al. | |
| 6,440,797 B1 * | 8/2002 | Wu et al. | 438/261 |
| 6,465,303 B1 | 10/2002 | Ramsbey et al. | |
| 6,853,587 B1 * | 2/2005 | Forbes | 438/259 |
| 2005/0079674 A1 * | 4/2005 | Zheng et al. | 438/258 |

* cited by examiner

*Primary Examiner*—Walter L. Lindsay, Jr.
(74) *Attorney, Agent, or Firm*—Mikio Ishimaru

(57) ABSTRACT

A method for manufacturing an integrated circuit structure includes providing a semiconductor substrate and forming a gate dielectric layer over the semiconductor substrate. The gate dielectric layer is formed in a plurality of thicknesses in a plurality of devices regions over the semiconductor substrate. A second dielectric layer is formed over at least one of the devices regions. A third dielectric layer is formed over at least a portion of the second dielectric layer. Ion traps are then selectively implanted in portions of the second dielectric layer.

9 Claims, 3 Drawing Sheets

MULTI-LEVEL GATE SONOS FLASH MEMORY DEVICE WITH HIGH VOLTAGE OXIDE AND METHOD FOR THE FABRICATION THEREOF

TECHNICAL FIELD

The present invention relates generally to semiconductor integrated circuit devices and methods for the production thereof, and more particularly to devices having non-volatile memories and associated circuits on the same device.

BACKGROUND ART

Over the years, developments and improvements in semiconductor performance have been achieved by focusing on a wide range of disciplines. Significant semiconductor improvements have resulted, for example, from device miniaturization, while others have been realized by creating multifunction devices on a single semiconductor chip or die.

Historically, semiconductor devices can be broadly divided into two categories: data processing (logic) devices and data storage (memory) devices. Devices that perform these two different functions have customarily been located on their own separate physical devices. However, with increasing miniaturization and complexity, these functions are increasingly being located together on the same semiconductor chip or die. Memory cells, for example, will typically be located in one region (a "core" region), but will also be provided with surrounding supporting devices in outer "periphery" regions. The periphery regions contain functions that support the memory cells (functions such as address decoders, read/write buffers, and sense amplifiers) that require different manufacturing procedures from those required for the core regions.

The creation of many semiconductor devices starts with growing a first layer of gate oxide over the surface of the silicon wafer where the semiconductor device is to be located. The gate oxide is a thin layer that allows better adhesion between the overlying layers (to be applied later) and the underlying silicon. The first layer of gate oxide also acts as a stress relaxation layer during manufacturing of the semiconductor device.

Device performance is highly dependent on the thickness of the first layer of gate oxide. Modern devices combine field effect transistor ("FET") devices with other logic devices on the same semiconductor die. The differing functions provided by the various individual semiconductors in the core and in the periphery regions require gate oxide layers of different thicknesses. Typically, logic function devices require the use of a thin layer of gate oxide to enhance overall device performance, while a thicker gate oxide is required for the access transistors of dynamic random access memory ("DRAM") cells. As an example, when the gate voltage on an FET access transistor for the memory cells is 7 volts, the corresponding gate voltage on FET's of the logic portion of the circuit will be only about 3.3 volts.

In flash memory electrically-erasable programmable and read-only memory ("EEPROM") devices, the gate oxide (also called a tunnel oxide in this type of device) is located under the floating gates of the flash memory cells. Data retention requirements of EEPROM devices require that these layers of tunnel oxide have at least a fairly large thickness, a requirement that may conflict with the oxide layer thickness requirements of periphery devices within the overall EEPROM device die. That is, for non-volatile memory devices, the data entry and erase transistors typically require high data retention, which also means relatively thick layers of gate oxide. But the surrounding periphery logic functions require high operating speed, which means relatively thin layers of gate oxide.

Thus, high voltage devices such as program and erase transistors require a relatively thick layer of gate oxide to protect the device against high voltage breakdown. However, other devices that are designed for speed require a thin layer of oxide. These differing requirements gain further importance as devices get smaller and smaller (with device features in the micron and sub-micron range). Thus, the layers of gate oxide that are required for these various devices need to be of different thickness levels. As time passes and circuits become smaller and ever more complex, it is becoming increasingly important to be able to fabricate all these devices on the same semiconductor die regardless of such gate oxide thickness differences.

Non-volatile memory devices are currently in widespread and increasing use in electronic products. Non-volatile memory devices retain stored information after the electrical power is terminated. In addition to EEPROM devices, non-volatile memory devices include read-only-memory ("ROM"), programmable-read-only memory ("PROM"), and erasable-programmable-read-only memory ("EPROM") devices. EEPROM devices differ from other non-volatile memory devices in that EEPROM devices can be electrically programmed and erased. Flash EEPROM devices are similar to EEPROM devices in that the memory cells can be programmed and erased electrically. However, flash EEPROM devices also enable the erasing of all memory cells in the device using a single electrical current pulse.

Product development efforts in EEPROM device technology have focused on increasing the programming speed, lowering programming and reading voltages, increasing data retention time, reducing cell erasure times, and reducing cell dimensions. In this regard, one important dielectric material for the fabrication of the EEPROM devices is an oxide-nitride-oxide ("ONO") structure. This structure is three dielectric materials layered on one another, such as silicon oxide ("$SiO_2$"), silicon nitride ("SiN"), and silicon oxide. During programming, electrical charge is transferred to the silicon nitride layer in the ONO structure, where it is retained even after the device has been turned off. A flash memory cell that utilizes the ONO structure is referred to as a Silicon-Oxide-Nitride-Oxide-Silicon ("SONOS") type cell.

An advantage of SONOS flash memory transistors is that they may have a lower programming voltage than some other nonvolatile memory devices. As an example, a SONOS transistor may be programmed and/or erased with a voltage of about half the voltage of other nonvolatile memory technology. Such a lower programming voltage can result in a nonvolatile storage circuit that may be more easily utilized with existing manufacturing processes.

Although there are many advantages with SONOS type memory devices, there are some disadvantages as well. In some instances, it is difficult to form the charge trapping layer over a silicon substrate or gate oxide layer with precision, uniformity, high quality (no defects), and without contamination. This presents challenges for precisely and uniformly forming ONO sub-layers having predetermined thicknesses. Thus, important factors toward achieving high performance SONOS cells include the thickness, quality, and cleanliness of the ONO structure, which cannot be sufficiently guaranteed with many known fabrication techniques.

Another disadvantage with SONOS type memory devices is the high temperature process that is needed to make the ONO structures. This high heat can cause undesirable distortion of prior structures already formed on the semiconductor die.

There is thus an unmet need for more advanced and economical methods for producing SONOS-type nonvolatile memory devices having improved material purity (leading to improved poly-to-source/drain isolation), little or no heat-induced distortion (such as excessive diffusion of implants), and multiple gate oxide thicknesses on a single chip for accommodating core and periphery devices that are formed at the same time and with the same processes. Desirably, these more advanced methods will use existing processing techniques, thus avoiding additional complexity and expense in the wafer fabrication process.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit structure. A semiconductor substrate is provided, and a gate dielectric layer is formed over the semiconductor substrate. The gate dielectric layer is formed in a plurality of thicknesses in a plurality of devices regions over the semiconductor substrate. A second dielectric layer is then formed over at least one of the devices regions. A third dielectric layer is then formed over at least a portion of the second dielectric layer. Ion traps are then selectively implanted in portions of the second dielectric layer. This method provides a means of manufacturing SONOS-type memory devices using existing processing techniques and avoiding additional complexity and expense in wafer fabrication processes.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
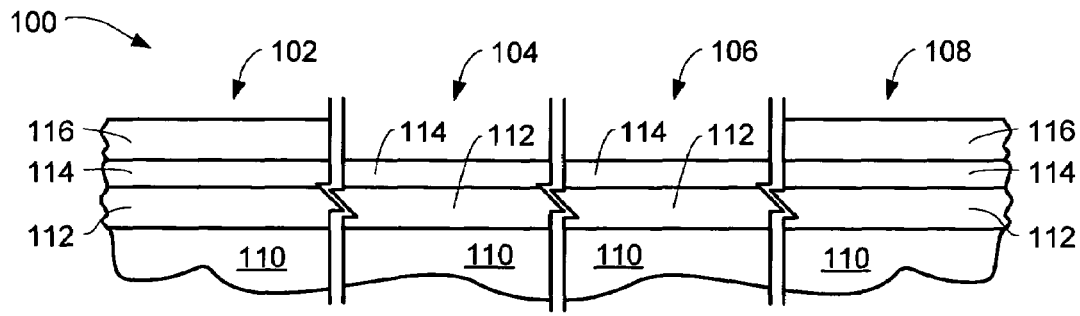
FIG. 1 is a cross-sectional view of portions of a silicon wafer including a semiconductor substrate, a gate dielectric layer, and a second dielectric layer, with a photomask patterned and deposited over the second dielectric layer in accordance with the present invention.

Memory and logic technologies have largely evolved along separate paths. In memory technology, for any particular lithography and power supply voltage level, the gate oxide thickness is limited by thin oxide reliability due to the stress of voltage-boosted functions. In contrast, for logic technology, thinner gate oxide thicknesses are generally the standard due to the need for high performance at lower internal operating voltages. Therefore, efforts to merge the technologies of memory and logic onto a single chip create a dilemma, i.e., the design choice of either (1) compromising the gate oxide thickness for one and/or both types of devices, or (2) assuming the complexities and expenses associated with forming two separate thicknesses (thickness levels) of gate oxides on a single chip.

Another configuration requiring multi-level gate oxide layers is metal oxide semiconductor ("MOS") devices, when combined p-channel MOS ("PMOS") and n-channel MOS ("NMOS") devices are created. The majority carriers of PMOS devices are holes; the majority carriers of NMOS devices are electrons. Holes have considerably lower mobility than electrons, resulting in a lower drive capability for the PMOS device. To compensate for this and to equalize the drive capability of the two types of devices, either the gate of the PMOS device is widened (allowing more drive current for a given gate voltage), or the thickness of the gate oxide layers for the two types of devices is adjusted to different thickness levels (allowing for higher gate current while maintaining gate width the same). Of these two solutions, the varying of the thicknesses of the gate oxide is the more promising since widening the gate electrode requires increased surface area, which is contrary to the need to miniaturize the devices.

One technique for creating gate oxide layers of different thicknesses is to form a sacrificial layer of oxide over the surface of the substrate, and then selectively implant ions in certain areas of the sacrificial oxide layer. The areas of the surface that have been ion implanted form thinner gate oxide layers than form over the surface that has not been subjected to ion implantation.

Another technique for forming multi-level oxide layers having different thicknesses is to use multiple steps of masking and oxide etch. The first layer (usually a gate layer) formed in this manner is typically the thickest layer and is initially formed on the surface of the substrate. This layer is masked with a layer of photoresist and etched to remove the unmasked layer of oxide from the substrate. The mask of photoresist is removed; a second layer of oxide is then formed over the surface of the substrate including the remaining first layer of oxide. This process results in a layer of oxide that has two thickness levels. This process can be repeated when additional levels of thickness are required, using a sequence of steps of deposition and etch. However, this process suffers from the disadvantage of many sequential processing steps and the repeated use of photoresist. Since photoresist is not easy to remove completely, layers of oxide of poor quality may result. Differing oxide layer thicknesses can also be obtained by just a partial etch back of a deposited oxide layer, but this also suffers from the same disadvantages.

Product development efforts in EEPROM device technology have focused on increasing the programming speed, lowering programming and reading voltages, increasing data retention time, reducing cell erasure times, and reducing cell dimensions. In this regard, one important dielectric material for the fabrication of the EEPROM devices is an oxide-nitride-oxide ("ONO") structure having three layers of dielectric material on one another, such as silicon oxide ("SiO$_2$"), silicon nitride ("SiN"), and silicon oxide. Conventional flash memory cells made with this technology use a tunnel gate oxide layer and a poly-oxide-nitride-oxide-poly ("poly-ONO-poly") capacitor configuration for the floating gate. During programming, electrical charge is transferred from the substrate to the silicon nitride layer. Voltages are applied to the gate and drain of the EEPROM device, creating vertical and lateral electrical fields that accelerate the electrons as they flow along the length of the channel from the source, past the gate, and to the drain. As the electrons move along the channel, some of them gain sufficient energy to jump over the potential barrier of the bottom silicon oxide layer and become trapped in the silicon nitride layer. These electrons become trapped near the drain region because the electric fields are strongest near the drain.

In such structures, it is important that the ONO dielectric provide adequate poly-to-source/drain isolation. This is important because contamination and dopants/implants that undesirably become incorporated into an ONO dielectric will decrease the poly to source/drain isolation, thereby decreasing the reliability of the memory devices made therewith. This is especially a concern when bitlines are formed by implanting sources/drains after the ONO dielectric is formed. However, if the sources/drains are implanted prior to forming the ONO dielectric, unwanted excessive diffusion of the implants occurs during the several subsequent thermal cycles associated with making and annealing the ONO dielectric.

Despite these limitations, silicon-oxide-nitride-oxide-silicon ("SONOS") flash cell configurations do simplify the manufacturing process. However, integration with other devices on the semiconductor die is still complicated due to the differing gate dielectric layer thickness requirements. In SONOS memory configurations, the thin ONO layer, which has nitride traps to trap and hold charges, is used for the memory charge storage layer. High-voltage devices are also formed on the same silicon wafer for driving the memory cells, and these high-voltage devices require a thick dielectric layer. Further, apart from the complications of fabricating multi-level dielectric thicknesses on the same die for these different functions, it is additionally problematic to form and use an ONO layer for both the memory (flash cell) devices region and the high-voltage devices region. This is because an ONO layer with nitride traps (or defects) has not served well as a good dielectric layer for the high-voltage devices, thus requiring extra steps to fabricate the ONO layers separately.

In contrast, the present invention provides an uncomplicated complimentary metal oxide semiconductor ("CMOS") process to fabricate multiple thickness dielectrics for SONOS flash cell regions, high-voltage devices regions, input/output ("I/O") devices regions and core circuit devices regions. Further, the present invention produces the ONO film layer for the SONOS memory devices and the high-voltage devices in the same process steps.

Referring now to FIG. 1, therein is shown a cross-section of a silicon wafer 100 in the first stages of processing to fabricate a semiconductor device having multiple regions for individual devices with differing gate dielectric layer thickness requirements. For example, there are flash cell devices regions 102, I/O devices regions 104, core devices regions 106, and high-voltage devices regions 108. Typically, the I/O devices regions 104 tend to be located in periphery regions of the overall semiconductor device and operate with voltages around twice that of the circuit devices located in the core devices regions 106.

The silicon wafer 100 has a semiconductor substrate 110, such as silicon ("Si"), on which a gate dielectric layer 112 of substantially uniform thickness has been formed. The gate dielectric layer 112, usually of silicon oxide ("SiO$_2$"), has a second dielectric layer 114, such as silicon nitride ("SiN") formed thereover, such as by reduced pressure chemical vapor deposition ("CVD"). A first photomask 116 is then patterned and deposited over the second dielectric layer 114, but only in the flash cell devices regions 102 and the high-voltage devices regions 108.

The term "horizontal" as used herein is defined as a plane parallel to the conventional plane or surface of the silicon wafer 100, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 2:
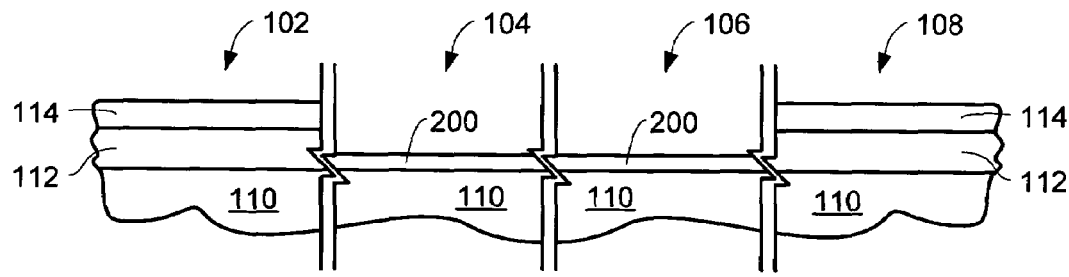
FIG. 2 is the structure of FIG. 1 following etching of the second dielectric layer and a portion of the gate dielectric layer.

Referring now to FIG. 2, therein is shown the structure of FIG. 1 following etching of the second dielectric layer 114 and a portion of the gate dielectric layer 112 in the I/O devices regions 104 and the core devices regions 106 not protected by the first photomask 116. The remaining gate dielectric layer 112 is a thinner, unremoved gate dielectric layer 200.

Figure 3:
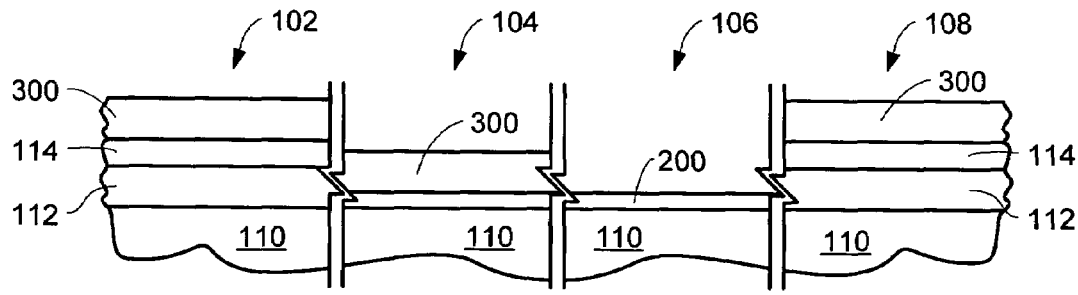
FIG. 3 is the structure of FIG. 2 with a second photomask patterned and deposited in accordance with the present invention.

Referring now to FIG. 3, therein is shown the structure of FIG. 2 having a second photomask 300 patterned and deposited over the several layers in the flash cell devices regions 102, I/O devices regions 104, and high-voltage devices regions 108, but not the core devices regions 106.

Figure 4:
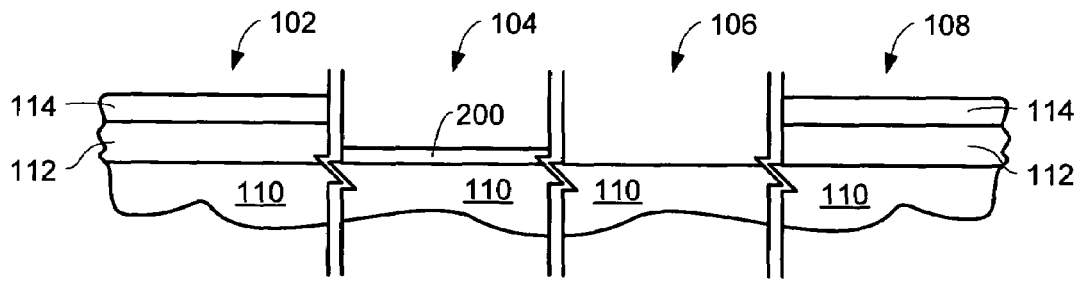
FIG. 4 is the structure of FIG. 3 after etching of the remaining unmasked gate dielectric layer and removal of the second photomask.

Referring now to FIG. 4, therein is shown the structure of FIG. 3 following etching of the remaining gate dielectric layer 200 in the core devices regions 106, and removal of the second photomask 300.

Figure 5:
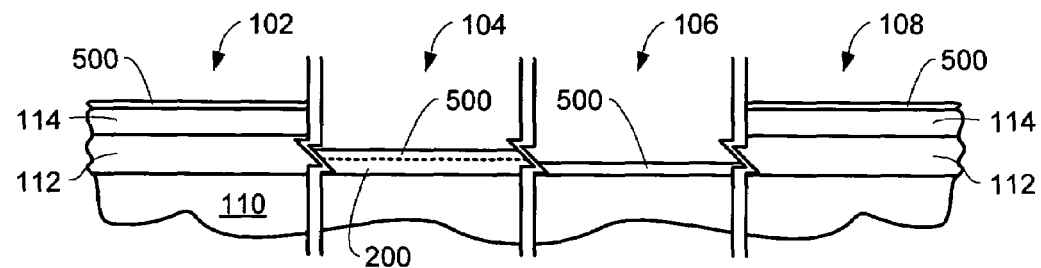
FIG. 5 is the structure of FIG. 4 after formation of a third dielectric layer on all the devices regions.

Referring now to FIG. 5, therein is shown the structure of FIG. 4 following formation of a third dielectric layer 500, such as by rapid thermal oxidation ("RTO"), on all the devices regions 102, 104, 106, and 108. The third dielectric layer 500 that is grown in the flash cell devices regions 102 and the high-voltage devices regions 108 will show the thinnest growth since it is grown on silicon nitride. The third dielectric layer 500 that is grown in the I/O devices regions 104 will be thicker. The third dielectric layer 500 that is grown in the core devices regions 106 is fresh oxide that is grown directly from the exposed silicon of the semiconductor substrate 110, and therefore will be thickest.

Figure 6:
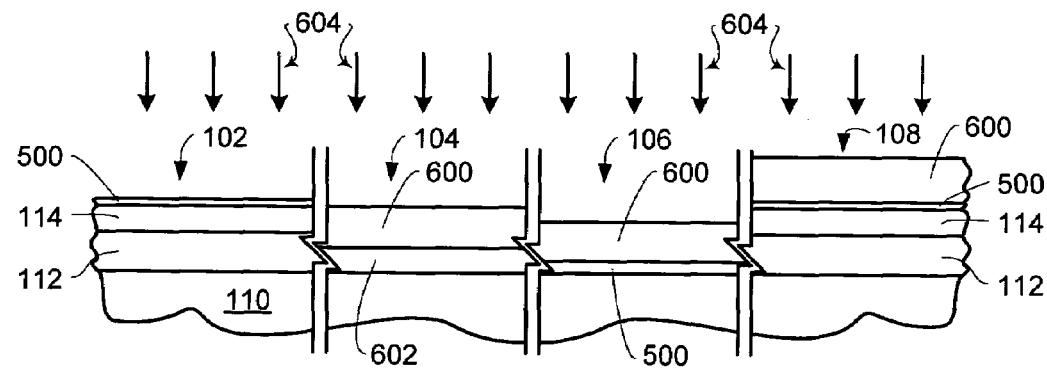
FIG. 6 is the structure of FIG. 5 receiving ion implantation after patterning and deposition of a third photomask in accordance with the present invention.

Referring now to FIG. 6, therein is shown the structure of FIG. 5 following patterning and deposition of a third photomask 600 over the various layers in the I/O devices regions 104, core devices regions 106, and high-voltage devices regions 108, but not the flash cell devices regions 102. Implantation arrows 604 illustrate implantation of ions for charge traps in the second dielectric layer 114 of the flash cell devices regions 102. For a typical second dielectric layer 114 of SiN, the implantation will produce nitride traps using ions containing H⁺, N⁻, O⁻⁻ or their combinations. The implantation is selective and does not occur in the devices regions 104, 106, and 108 due to the third photomask 600.

Also illustrated in FIG. 6 is the combined gate dielectric layer 602 in the I/O devices regions 104, which is the combination of the unremoved gate dielectric layer 200 and the third dielectric layer 500 for the I/O devices regions 104 as shown in FIG. 5. As shown in FIG. 6, the combined gate dielectric layer 602 is thicker than the third dielectric layer 500 that was formed in this region, and generally intermediate the thicknesses of the third dielectric layer 500 in the core devices regions 106 and the original gate dielectric layer 112 still remaining in the flash cell devices regions 102 and the high-voltage devices regions 108.

Figure 7:
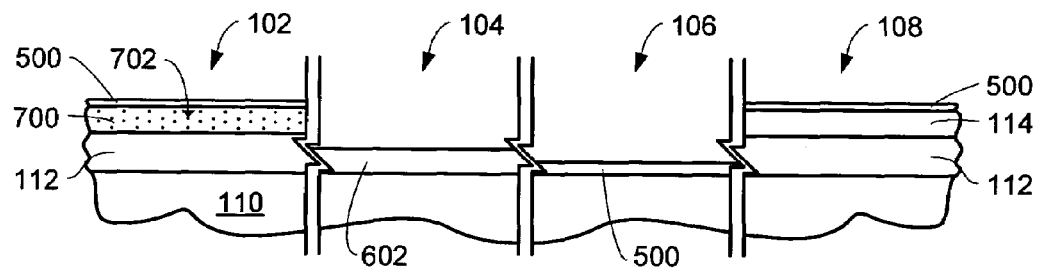
FIG. 7 is the structure of FIG. 6 after ion implantation and removal of the third photomask.

Referring now to FIG. 7, therein is shown the structure of FIG. 6 following removal of the third photomask 600. The second dielectric layer 114 in the flash cell devices regions 102, following the implantation illustrated in FIG. 6, forms an implanted dielectric layer 700 having ion traps 702.

Figure 8:
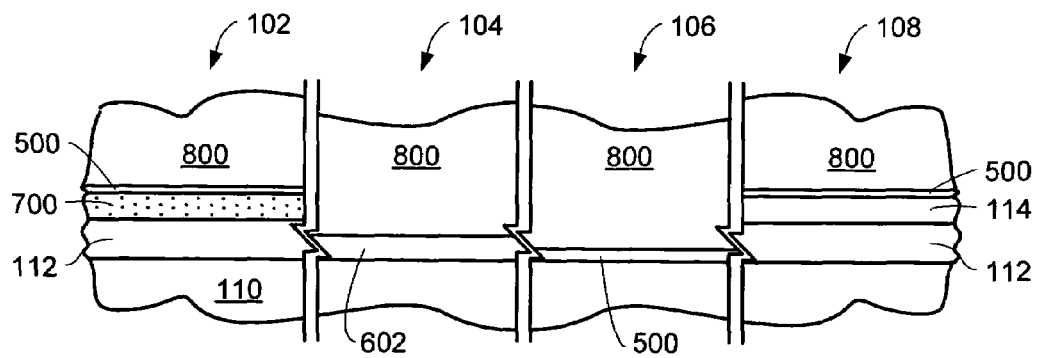
FIG. 8 is the structure of FIG. 7 after formation of a fourth conductive layer on all the devices regions.

Referring now to FIG. 8, therein is shown the structure of FIG. 7 following formation of a fourth conductive layer 800 on the several layers in all the devices regions. The fourth conductive layer 800 will normally form the control gate layer for the several devices in each region, and will typically be a polymorphous silicon ("poly") material.

Figure 9:
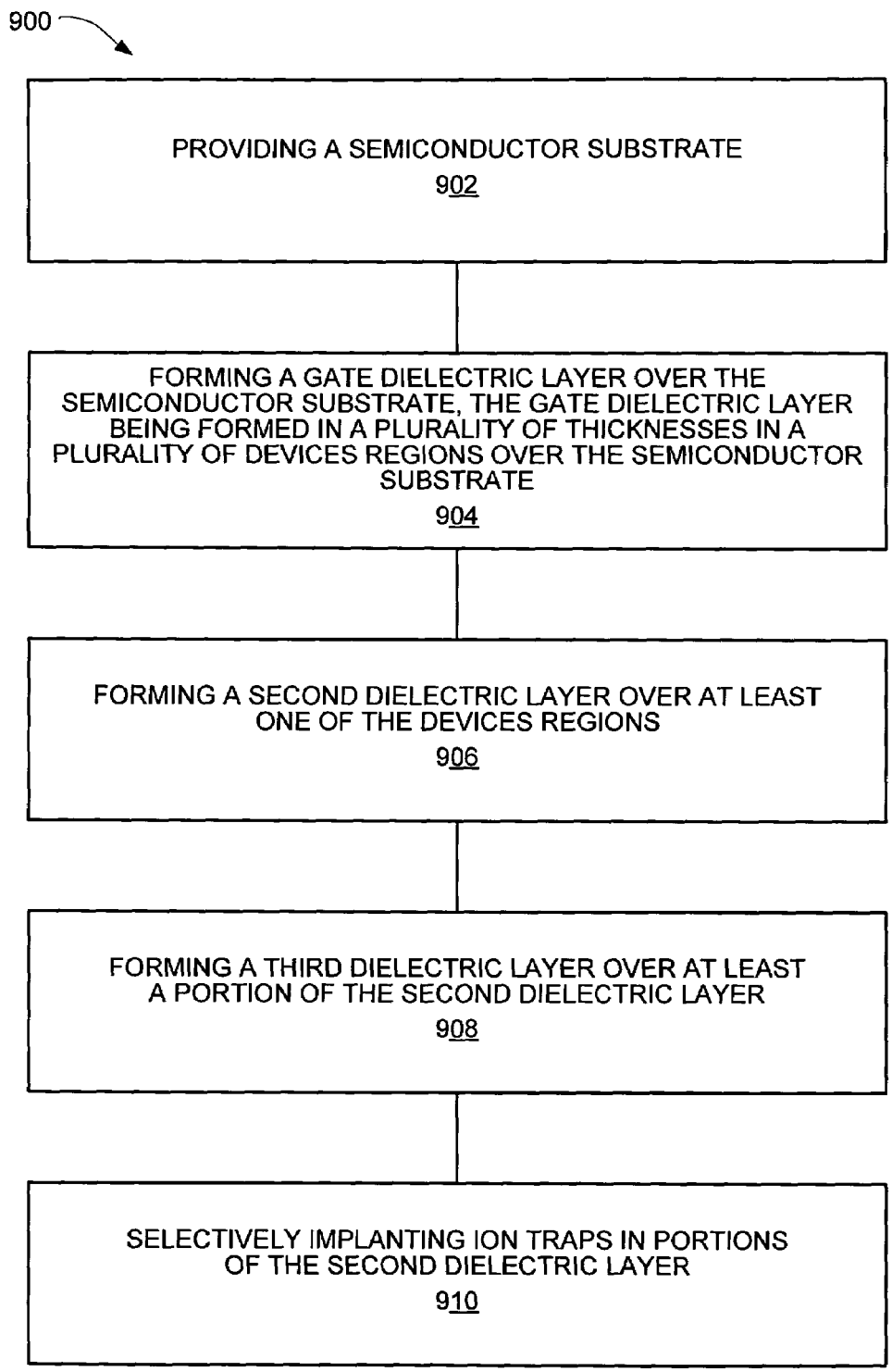
FIG. 9 is a flowchart of the method for fabricating a multi-level gate SONOS flash memory device with high-voltage oxide in accordance with the present invention.

Referring now to FIG. 9, therein is shown a flowchart of a method 900 for fabricating a multi-level gate SONOS flash memory device with high-voltage oxide. The method includes a step 902 of providing a semiconductor substrate; a step 904 of forming a gate dielectric layer over the semiconductor substrate, the gate dielectric layer being formed in a plurality of thicknesses in a plurality of devices regions over the semiconductor substrate; a step 906 of forming a second dielectric layer over at least one devices region of the semiconductor substrate; a step 908 of forming a third dielectric layer over at least portions of the second dielectric layer; and a step 910 of selectively implanting ion traps in portions of the second dielectric layer.

In greater detail, the manufacturing method to produce the multi-level gate SONOS flash memory device with high-voltage oxide is performed as follows:
1. The semiconductor substrate 110 is suitably prepared and the gate dielectric layer 112 of SiO₂ is formed thereon. Then the second dielectric layer 114 of SiN is formed over the gate dielectric layer 112. Next, the first photomask 116 is patterned and formed over the second dielectric layer 114 in the flash cell devices regions 102 and high-voltage devices regions 108. (FIG. 1)
2. The second dielectric layer 114 and a portion of the gate dielectric layer 112 are etched to remove them in the I/O devices regions 104 and the core devices regions 106 not protected by the first photomask 116. The first photomask 116 is then removed. (FIG. 2)
3. The second photomask 300 is then formed over the layers in the flash cell devices regions 102, the I/O devices regions 104, and the high-voltage devices regions 108. (FIG. 3)
4. The unremoved gate dielectric layer 200 is then etched to remove it in the core devices regions 106, following which the second photomask 300 is removed. (FIG. 4)
5. The third dielectric layer 500 is then formed over the layers in all the devices regions 102, 104, 106, and 108. (FIG. 5)
6. The third photomask 600 is then formed over the layers in all the devices regions except the flash cell devices regions 102, and the entire structure then receives implantations for nitride traps, such as by ions containing H⁺, N⁻, O⁻⁻, or their combinations. Due to the protection of the third photomask 600, the implantation into the dielectric layers actually occurs only to the second dielectric layer 114 in the flash cell devices regions 102. Also, in the I/O devices regions 104, the unremoved gate dielectric layer 200 and the third dielectric layer 500 are now combined to form the thicker gate dielectric layer 602. (FIG. 6)
7. The third photomask 600 is then removed. The structure at this point now includes the implanted dielectric layer 700 in the flash cell devices regions 102, which is the second dielectric layer 114 after receiving the implantation illustrated by the implantation arrows 604 in FIG. 6. (FIG. 7)
8. The fourth conductive layer 800 (for example, a poly gate) is then formed in all regions of the device, following which the device is completed in conventional manner (not shown). (FIG. 8)

The final structure is a multi-level gate SONOS flash memory device fabricated with an uncomplicated CMOS process that yields four different gate dielectric thickness regions. The thinnest thickness level is for the high-speed, low-voltage core devices regions. The gates for the I/O (periphery) devices are thicker, since these devices operate at voltages, for example, twice that of the high-speed core devices. Even thicker gates are provided for the high-voltage devices, such as for the high-voltage transistors that do the flash cell programming.

Simultaneously, using the same processes, the SONOS flash cell dielectrics are also formed. Additionally, by carefully controlling the implantation of the defects/traps in the flash cell ONO layer, the necessary charge-holding functionality is imparted in the same process steps in which the high-voltage gate layers are formed. The result is a straightforward, economical, uncomplicated, and highly versatile process using conventional technologies to simultaneously form all the devices regions on the die.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hitherto-fore set forth herein or shown in the accompanying drawings are to be interpreted in an illustrative and non-limiting sense.

What is claimed is:

1. A method for manufacturing an integrated circuit structure, comprising:
   providing a semiconductor substrate;
   forming a gate dielectric layer over the semiconductor substrate, the gate dielectric layer being formed in a plurality of thicknesses in a plurality of devices over the semiconductor substrate;
   forming a second dielectric layer over at least one of the devices regions;
   forming a third dielectric layer over at least a portion of the second dielectric layer,
   selectively implanting ion traps in portions of the second dielectric layer; and
   the gate dielectric layer being formed in a plurality of thicknesses by:

initially forming the gate dielectric layer over the semiconductor substrate in a substantially uniform thickness;

forming the second dielectric layer over the gate dielectric layer;

patterning and forming a photomask over at least one devices region;

removing the second dielectric layer in other devices regions;

removing at least portions of the gate dielectric layer in the other devices regions; and forming the third dielectric layer over a plurality of the devices regions including at least one of the other devices regions, the third dielectric layer combining with unremoved portions of the gate dielectric layer in the other devices regions to form a thicker dielectric layer therein.

2. The method of claim 1 wherein the ion traps are implanted through the third dielectric layer.

3. The method of claim 1 further comprising forming a fourth conductive layer over the layers in the devices regions.

4. The method of claim 3 wherein the fourth conductive layer is a poly control gate layer.

5. A method for manufacturing an integrated circuit structure, comprising:

providing a semiconductor substrate having at least first, second, third, and fourth devices regions;

forming a gate dielectric layer over the semiconductor substrate;

forming a second dielectric layer over the gate dielectric layer;

patterning and forming a first photomask over a least the first and fourth devices regions;

removing the second dielectric layer in the second and third devices regions;

removing a portion of the gate dielectric layer in the second devices region and the entire gate dielectric layer in the third devices region;

forming a third dielectric layer over the first, second, third, and fourth devices regions, the third dielectric layer combining with the unremoved portion of the gate dielectric layer in the second devices region to form a thicker dielectric layer therein; and selectively implanting ion traps in the second dielectric layer in the first devices region.

6. The method of claim 5 wherein the ion traps are implanted through the third dielectric layer.

7. The method of claim 5 further comprising forming a fourth conductive layer over the layers in the devices regions.

8. The method of claim 7 wherein the fourth conductive layer is a poly control gate layer.

9. The method of claim 5 wherein the first devices region is a flash cell devices region, the second devices region is an I/O devices region, the third devices region is a core devices region, and the fourth devices region is a high-voltage devices region.

* * * * *